(12) United States Patent
Liu et al.

(10) Patent No.: US 6,744,142 B2
(45) Date of Patent: Jun. 1, 2004

(54) FLIP CHIP INTERCONNECTION STRUCTURE AND PROCESS OF MAKING THE SAME

(75) Inventors: Cheng-Yi Liu, Taoyuan (TW); Shen-Jie Wang, Taipei (TW); Cheng-Heng Kao, Tao-Yuang (TW)

(73) Assignee: National Central University, Taoyuan (TW)

( * ) Notice: Subject to any disclaimer, the term of this patent is extended or adjusted under 35 U.S.C. 154(b) by 0 days.

(21) Appl. No.: 10/248,992

(22) Filed: Mar. 7, 2003

(65) Prior Publication Data

US 2003/0234453 A1 Dec. 25, 2003

Related U.S. Application Data

(62) Division of application No. 10/065,297, filed on Oct. 1, 2002, now Pat. No. 6,642,079.

(30) Foreign Application Priority Data

Jun. 19, 2002 (TW) .......................................... 9111337 A

(51) Int. Cl.[7] .............................................. H01L 29/40
(52) U.S. Cl. ........................ 257/778; 257/766; 257/737
(58) Field of Search ................................ 257/737, 738, 257/778, 772, 766

(56) References Cited

U.S. PATENT DOCUMENTS 6,570,251 B1 * 5/2003 Akram et al. ................ 257/738
6,642,079 B1 * 11/2003 Liu et al. ..................... 438/108

* cited by examiner

Primary Examiner—Roy Potter
(74) Attorney, Agent, or Firm—Jiang Chyun IP Office

(57) ABSTRACT

In a process of fabricating flip chip interconnection, a UBM layer is deposited on an I/O pad of a chip. The UBM layer includes a nickel layer. On the UBM layer is formed a tin-containing solder material. The chip is mounted on a carrier substrate by alignment of the bonding pad with a contact pad of the carrier substrate. A reflow process is performed to respectively turn the tin-containing solder material to a tin-containing solder bump and form a composite intermetallic compound on the nickel layer of the UBM to prevent its spalling.

8 Claims, 5 Drawing Sheets

FLIP CHIP INTERCONNECTION STRUCTURE AND PROCESS OF MAKING THE SAME

CROSS REFERENCE TO RELATED APPLICATIONS

This application is a divisional application of, and claims the priority benefit of, U.S. application Ser. No. 10/065,297 filed on Oct. 01, 2002 now U.S. Pat. No. 6,642,079.

BACKGROUND OF INVENTION

1. Field of the Invention

The invention relates generally to flip chip interconnection structure and a manufacture process of the flip chip interconnection structure that prevent spalling effects. More particularly, the invention forms a composite intermetallic compound in the flip chip interconnection structure to prevent spalling effects.

2. Description of the Related Art

In response to the concern of environmental pollution by lead (Pb) which seriously affects human health, the industrialized countries have implemented restrictive standards to reduce as much as possible the use of lead-containing substances in industrial products and manufacture processes. In some aspects, those restrictions have met successful results such as, for example, the developments of automobile lead-free fuel and lead-free paint products. In other aspects such as electronic products, more restrictions are expected to accelerate the ban of lead-containing substances in manufactured products. In this purpose, the Ministry of Trade and Industry of Japan has already passed a regulation that prohibits the sale of electric and electronic products in Japan that contain lead substances after the year of 2002. The European Commission proposes the implementation of similar restrictive measures after the year of 2007. Therefore, the particular development of lead-free solder materials, solder materials being widely used in the microelectronic and semiconductor industries, appears to be a technical necessity for the manufacturers that want to conform to the future national and international anti-pollution legislation.

In the semiconductor packaging process, the use of lead-free solder material has met concrete developments in respect of certain aspects such as for attachments of ball grid array (BGA) packages or surface mount dies. However, many problems remain with respect to some particularly critical techniques that require the use of lead-containing substances. For example, to achieve a controlled collapse chip connection (C4), the skilled artisan knows that the use of lead-free solder material for the connecting bumps between the chip and the carrier substrate causes spalling effects of the UBM layer. This consequently deteriorates in substantial manner the strength of the solder joint within the flip chip interconnection structure.

FIG. 1 is a schematic view that illustrates a conventional flip chip interconnection structure. As illustrated, a conventional flip chip interconnection structure usually attaches a chip 100 through bumps 108 to a carrier substrate 110. An underfill material 114 is further filled between the chip 100 and the carrier substrate 110 to buffer the mechanical stresses induced in the bumps 108 due to thermal mismatch between the chip 100 and the carrier substrate 110.

An active surface 100a of the chip 100 includes bonding pads 102 and a passivation layer 104 that has openings 105 exposing the bonding pads 102. The carrier substrate 110 includes contact pads 112 that correspond to the bonding pads 102. To achieve a flip chip interconnection through the bumps 108, an under bump metallization (UBM) layer 106 is commonly interfaced between each bonding pad 102 and bump 108.

A structure of UBM layer 106 known in the prior art comprises a chromium (Cr) layer 106a, a copper (Cu) layer 106b and a gold (Au) layer 106c, while the bumps 108 are commonly made of a solder material. After the UBM layers 106 and the solder material of the bumps 108 have been formed, the chip 100 is mounted on the carrier substrate 110 and a reflow process is performed to turn the solder material to solder bumps 108.

Besides Cr/Cu/Au triple-layers structure, a double-layers structure of the UBM layer comprising chromium/nickel is also known in the prior art. When the UBM layer comprises a triple-layers structure of Cr/Cu/Au, tin (Sn) in the solder material will typically react with copper of the UBM layer to form copper-tin (Cu—Sn) intermetallic compound. In the case of a double-layers structure Cr/Ni of the UBM layer, tin (Sn) of the solder material will typically react with nickel (Ni) of the solder material to form a tin-nickel (Sn—Ni) intermetallic compound.

Regardless whether it is composed of Cu—Sn compound or Sn—Ni compound, the known intermetallic compound has high interfacial energy with chromium of the UBM layer. As a result, during reflowing, the Cu—Sn or Sn—Ni intermetallic compound spalls and becomes spherical, and then peels from the surface of the chromium layer of the UBM layer to flow into the solder material. This spalling and peeling effect seriously deteriorates the strength of the solder joint in the flip chip package.

SUMMARY OF INVENTION

An aspect of the invention is therefore to provide a flip chip interconnection structure and a process for fabricating the same flip chip interconnection structure, in which a composite intermetallic compound is formed to prevent spalling effects.

To accomplish the above and other objectives, a flip chip interconnection structure of the invention comprises at least a tin-containing solder bump that is selectively formed between a bonding pad of an electronic chip and a contact pad of a carrier substrate. The tin-containing solder bump is formed on an under bump metallization (UBM) layer itself formed on the bonding pad of the chip. A composite intermetallic is interfaced between the tin-containing solder bump and the UBM layer to prevent the occurrence of spalling effects of the UBM layer. An underfill material is further filled between the chip and the carrier substrate to encapsulate the tin-containing solder bump.

In accordance with the above and other objectives, the invention further provides a manufacture process of a flip chip interconnection structure suitable for flip chip bonding of an electronic chip to a carrier substrate. A UBM layer is formed on at least a bonding pad of the chip, and a tin-containing solder material is formed on the UBM layer. The chip is mounted on the carrier substrate by alignment of the bonding pad with a contact pad of the carrier substrate. A copper reservoir is further provided in proximity of the tin-containing solder material. A reflow process then is performed to respectively turn the tin-containing solder material to a tin-containing solder bump and form a composite intermetallic compound between the tin-containing solder bump and the UBM layer to prevent spalling effects.

According to a preferred embodiment of the invention, the UBM layer includes a nickel (Ni) layer that reacts with tin (Sn) of the solder material and copper (Cu) of the copper reservoir during reflowing to form the composite intermetallic compound. A portion of the composite intermetallic compound adjacent to the UBM layer thereby includes $Cu_6Sn_5$ while a portion of the composite intermetallic compound adjacent to the tin-containing solder bump includes $(Cu, Ni)_6Sn_5$. Via the formation of this composite intermetallic compound, the nickel layer of the UBM layer is isolated from the solder material, which therefore prevents spalling of the UBM layer.

According to one aspect of the invention, the copper reservoir is constituted via introducing copper particles in the tin-containing solder material formed on the UBM layer.

According to another aspect of the invention, the copper reservoir is constituted via having the contact pad of the carrier substrate made of copper.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
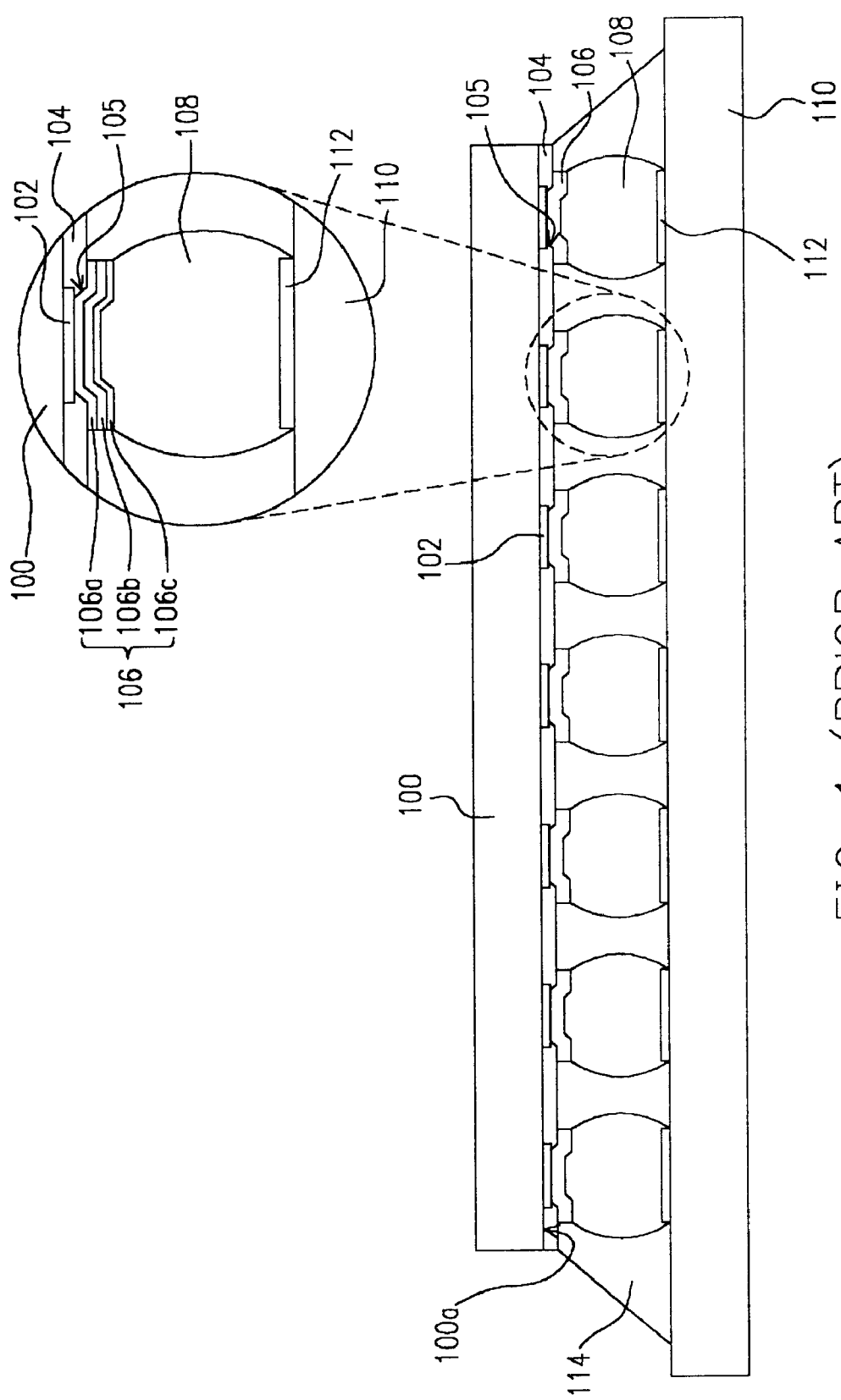
FIG. 1 is a schematic view that illustrates a conventional flip chip interconnection structure.

The following detailed description of the embodiments and examples of the present invention with reference to the accompanying drawings is only illustrative and not limiting. Furthermore, wherever possible in the description, the same reference symbols will refer to similar elements and parts unless otherwise illustrated in the drawings.

Figure 2:
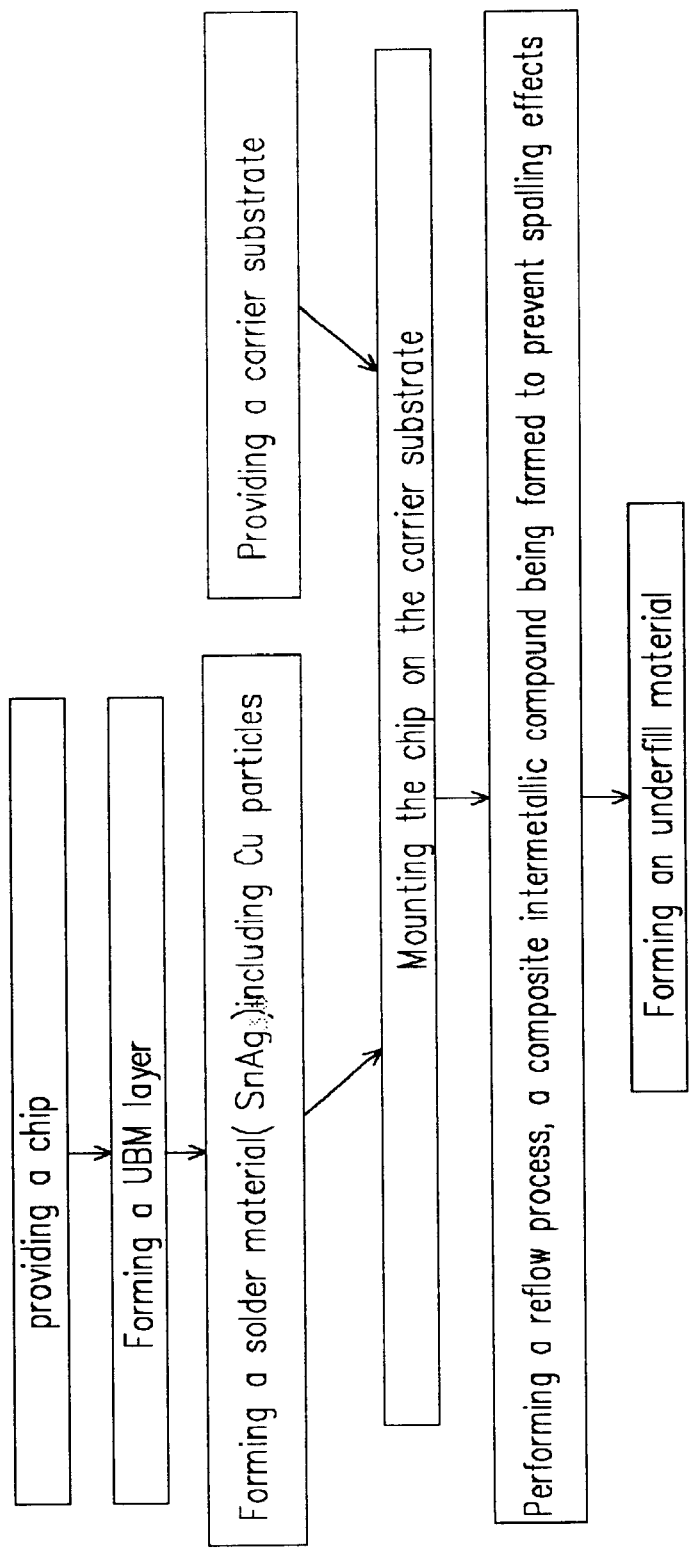
FIG. 2 is a flow chart that illustrates a manufacture process of a flip chip interconnection structure according to an embodiment of the invention.
Figure 3:
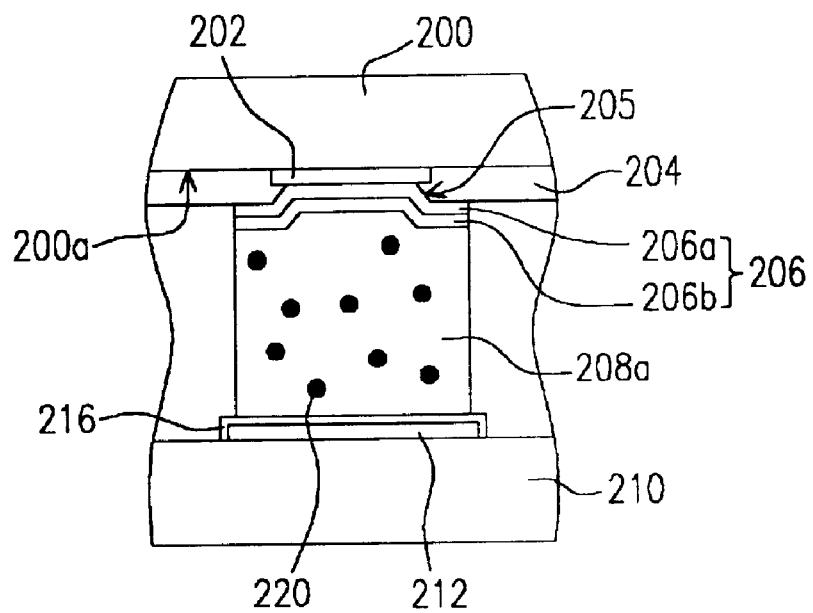
FIG. 3 is a schematic view of a stage in the manufacture process according to an embodiment of the invention, in which a tin-containing solder material includes copper particles as copper reservoir.
Figure 4:
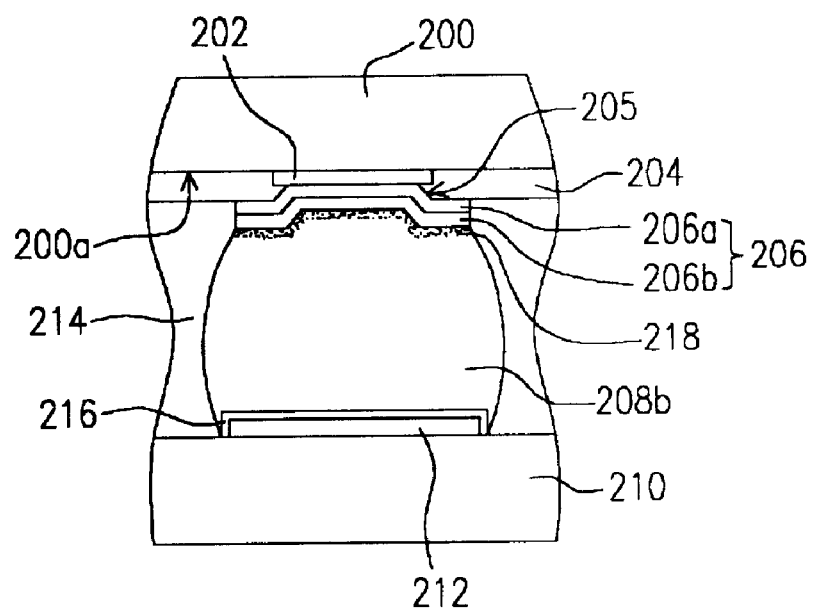
FIG. 4 is a schematic view of another stage in the manufacture process of the invention subsequent to the stage shown in FIG. 3, in which a bump and a composite intermetallic compound are formed by reflow process.

Reference now is made to FIG. 2 through FIG. 4 to describe the manufacture process of a flip chip interconnection structure according to an embodiment of the invention.

FIG. 2 is a flow chart of the manufacture process of the flip chip interconnection structure. As illustrated, the manufacture process comprises:

(a) providing a chip;
(b) forming an under bump metallization (UBM);
(c) forming a solder material including copper particles;
(d) providing a carrier substrate;
(e) mounting the chip on the carrier substrate;
(f) performing a reflow process in a manner to form a composite intermetallic compound for preventing spalling effects; and
(g) forming an underfill material.

Referring to FIG. 3, an active surface of a chip 200 includes at least a bonding pad 202 and, for example, a passivation layer 204 that covers the active surface 200a and is provided with at least an opening 205 that exposes the bonding pad 202. The bonding pad 202 may be made of, for example, aluminum, copper, or other adequate metals.

A UBM layer 206 is formed on the bonding pad 202. The UBM layer 206 is, for example, a double-layers structure preferably including a chromium (Cr) layer 206a (adhesion layer) and a nickel (Ni) layer 206b. The chromium layer 206a is, for example, 500 Å-thick, and the UBM layer 206 is, for example, 2000 Å-thick. On the UBM layer 206 is formed a tin-containing solder material 208a that includes copper particles 220. The solder material 208a is formed via, for example, screen printing. The solder material 208a is preferably lead-free solder such as, for example, $SnAg_{3.5}$, and the copper particles 220 may consist of, for example, high-purity (99.99%) copper.

Furthermore, a provided carrier substrate 210 includes at least a contact pad 212. The contact pad 212 can be made of adequate metals such as copper. The surface of the contact pad 212 may be further plated with a nickel film 216. The chip 200 then is mounted on the carrier substrate 210 by alignment of the bonding pad 202 with the contact pad 212. A reflow process is subsequently performed.

As illustrated in FIG. 3 and FIG. 4, to substantially limit spalling of the UBM layer 206, a copper reservoir is provided in proximity of the solder material 208a to trigger a reaction that forms a protective composite intermetallic compound. In the example illustrated in FIG. 3, the copper reservoir is constituted via the introduction of copper atoms under the form of particles 220 in the solder material 208a. During the subsequent reflow process, the added copper atoms diffuse within the entire solder material, and a nickel-containing (Ni—Sn) intermetallic compound is formed on the nickel layer 206b. As the copper atoms diffuse in the entire solder material, the solder material further reacts with the copper atoms to progressively deposit a copper-tin (Cu—Sn) intermetallic compound on the nickel-containing intermetallic compound, forming a composite intermetallic compound 218.

The above deposition of Cu—Sn intermetallic compound on the nickel-containing intermetallic compound isolates the nickel layer 206b from the solder material and effectively prevents a reaction there between. Furthermore, a solidification reaction occurs between the nickel layer 206b and the Cu—Sn intermetallic compound and the nickel-containing intermetallic compound, which further slows down the reaction involving the nickel layer 206b. The consumption of the nickel layer 206b is thereby prevented, which therefore substantially limits spalling of the UBM layer 206.

Referring to FIG. 4, after reflowing, the tin-containing solder material 208a is turned to a tin-containing solder bump 208b while the composite intermetallic compound 218 between the solder bump 208b and the nickel layer 206b includes two different types of material. A portion of the composite intermetallic compound adjacent to the nickel layer 206b includes $Cu_6Sn_5$ while a portion of the composite intermetallic compound adjacent to the solder bump 208b includes $(Cu, Ni)_6Sn_5$, formed by solidification.

After reflowing to form the solder bump 208b, an underfill material 214 is formed between the chip 200 and the substrate 210. The underfill material 214 can be, for example, polyimide. The underfill material 214 buffers the mechanical stresses induced in the solder bump 208b due to thermal mismatch between the chip 200 and the carrier substrate 210, which thereby improves the reliability of the interconnection structure.

Figure 5:
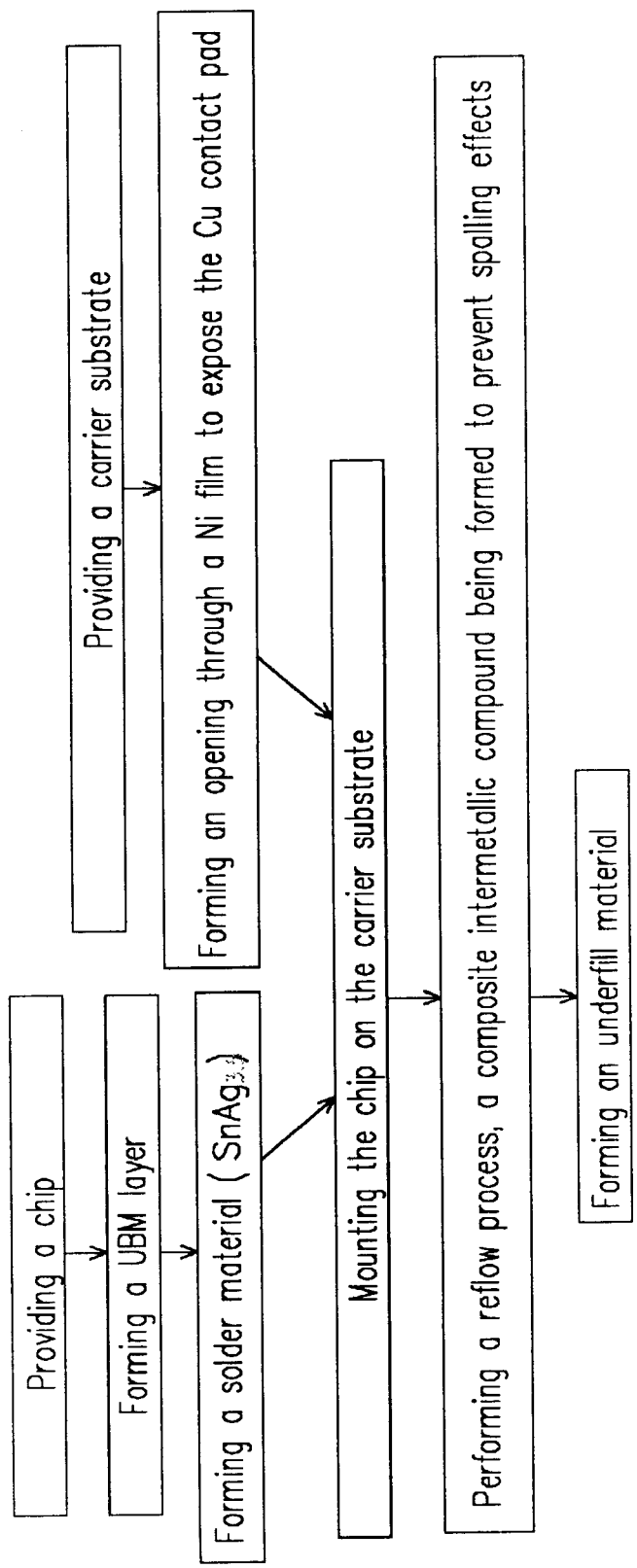
FIG. 5 is a flow chart that illustrates a manufacture process of a flip chip interconnection structure according to another embodiment of the invention.
Figure 6:
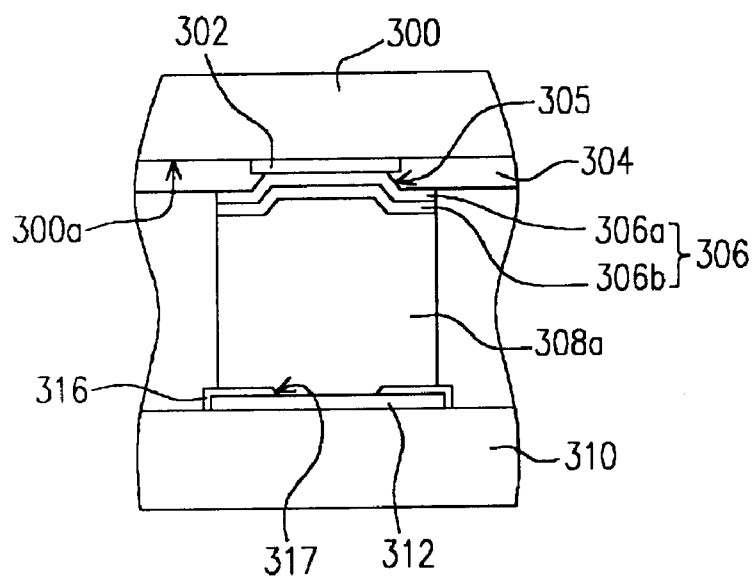
FIG. 6 is a schematic view of a stage in a manufacture process according to an embodiment of the invention, in which a copper contact pad of the carrier substrate is used as copper reservoir.
Figure 7:
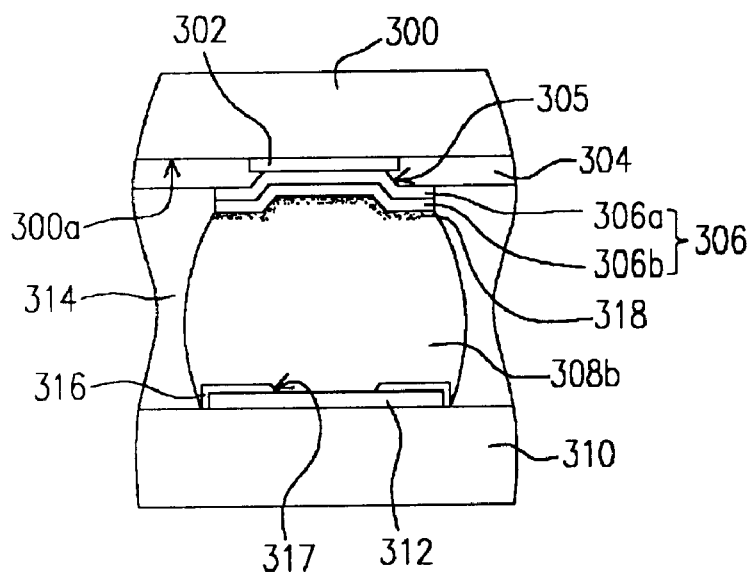
FIG. 7 is a schematic view of another stage in the manufacture process of the invention subsequent to the stage shown in FIG. 6, in which a bump and a composite intermetallic compound are formed by reflow process.

Reference now is made to FIG. 5 through FIG. 7 to describe the manufacture process of a flip chip interconnection structure that reduces the spalling effects according to another embodiment of the invention.

FIG. 5 is a flow chart illustrating the manufacture process of this variant embodiment of the invention. As illustrated, the manufacture process of this variant embodiment comprises:

(a) providing a chip including at least a bonding pad thereon;

(b) forming a UBM layer on the bonding pad;

(c) forming a solder material on the UBM layer;

(d) providing a carrier substrate having at least a copper bonding pad thereon;

(e) forming a passivation layer on the carrier substrate to expose the copper bonding pad;

(f) mounting the chip on the carrier substrate;

(g) performing a reflow process in a manner to form a composite intermetallic compound for preventing spalling; and (h) forming an underfill material.

This embodiment differs from the previous embodiment in that the copper reservoir needed to form the composite intermetallic compound is embodied through a contact pad of the carrier substrate that is made of copper.

As illustrated in FIG. 6, an active surface of a chip 300 includes at least a bonding pad 302 and a passivation layer 304 that covers the active surface 300a and is provided with at least an opening 305 that exposes the bonding pad 302.

A UBM layer 306 is formed on the bonding pad 302. The UBM layer 306 may have, for example, a double-layers structure including a chromium (Cr) layer 306a and a nickel (Ni) layer 306b. On the UBM layer 206 is formed a tin-containing solder material 308a by, for example, screen printing. The tin-containing solder material 308a is preferably lead-free solder such as, for example, $SnAg_{3.5}$.

Furthermore, a provided carrier substrate 310 includes at least a contact pad 312 preferably made of copper. Copper of the contact pad 312 preferably has a high purity of about 99.99%. A nickel film 316 is formed on the surface of the copper contact pad 312 and includes an opening 317 that partially exposes the copper contact pad 312. The chip 300 is mounted on the carrier substrate 310 by alignment of the bonding pad 302 with the copper contact pad 312. A reflow process then is performed.

During the reflow process, the copper reservoir of the copper contact pad 312 provides the copper atoms needed to form a composite intermetallic compound 318 in a manner similar to that described in the previous embodiment.

As illustrated in FIG. 7, after reflowing, the solder material 308a is turned to a tin-containing bump 308b. An underfill material 314 then is formed between the chip 300 and the carrier substrate 310.

As described above, the invention therefore provides a structure of flip chip interconnection that favorably prevents spalling of the UBM layer by interfacing a composite intermetallic compound between the UBM layer and the solder bump. The composite intermetallic compound is formed through a reaction between nickel from a nickel layer of the UBM layer, tin from the solder material, and copper from a copper reservoir. The copper reservoir may be embodied under different forms.

According to one embodiment, the copper reservoir is formed via adding copper particles in the solder material of the tin-containing bump.

According to another embodiment, the copper reservoir is embodied through a contact pad of the carrier substrate that is made of copper.

It should be apparent to those skilled in the art that other structures that are obtained from various modifications and variations of different parts of the above-described structures of the invention would be possible without departing from the scope and spirit of the invention as illustrated herein. Therefore, the above description of embodiments and examples only illustrates specific ways of making and performing the invention that, consequently, should cover variations and modifications thereof, provided they fall within the inventive concepts as defined in the following claims.

What is claimed is:

1. An interconnection structure suitable for flip chip bonding of an electronic chip to a carrier substrate, the chip including at least a bonding pad and the carrier substrate including at least a contact pad, the interconnection structure comprising:

an under bump metallization (UBM) layer, formed on the bonding pad, wherein the UBM layer includes an adhesion layer and a first nickel layer;

a tin-containing solder bump, formed between the bonding pad and the contact pad to electrically connect the chip to the carrier substrate; and a composite intermetallic compound, formed between the nickel layer of the UBM layer and the tin-containing solder bump.

2. The structure of claim 1, wherein the bonding pad is a copper bonding pad or an aluminum bonding pad.

3. The structure of claim 1, wherein the contact pad is a copper contact pad.

4. The structure of claim 3, wherein a second nickel layer is further formed on the copper contact pad.

5. The structure of claim 1, wherein a portion of the composite intermetallic compound adjacent to the first nickel layer includes $Cu_6Sn_5$.

6. The structure of claim 1, wherein a portion of the composite intermetallic compound adjacent to the tin-containing solder bump includes $(Cu, Ni)_6Sn_5$.

7. The structure of claim 1, wherein the adhesion layer includes chromium (Cr).

8. The structure of claim 1, wherein the tin-containing solder bump includes lead-free solder $SnAg_{3.5}$.

* * * * *